United States Patent [19]

Nakagawa et al.

[11] Patent Number: 5,086,323
[45] Date of Patent: Feb. 4, 1992

[54] CONDUCTIVITY MODULATED MOSFET

[75] Inventors: Akio Nakagawa, Hiratsuka; Hiromichi Ohashi, Yokohama; Yoshihiro Yamaguchi, Urawa; Kiminori Watanabe, Kawasaki; Thuneo Thukakoshi, Zushi, all of Japan

[73] Assignee: Kabushiki Kaisha Toshiba, Kawasaki, Japan

[21] Appl. No.: 712,997

[22] Filed: Jun. 10, 1991

Related U.S. Application Data

[63] Continuation-in-part of Ser. No. 532,366, Jun. 4, 1990, abandoned, which is a continuation of Ser. No. 249,822, Sep. 27, 1988, abandoned, which is a continuation of Ser. No. 116,357, Nov. 4, 1987, Pat. No. 4,881,120, which is a continuation of Ser. No. 19,337, Feb. 26, 1987, Pat. No. 4,782,372, which is a continuation of Ser. No. 738,188, May 28, 1985, Pat. No. 4,672,407.

[30] Foreign Application Priority Data

| May 30, 1984 | [JP] | Japan | 59-110244 |
| Sep. 29, 1984 | [JP] | Japan | 59-204427 |
| Nov. 20, 1984 | [JP] | Japan | 59-244811 |

[51] Int. Cl.$^5$ .................. H01L 29/10; H01L 29/78
[52] U.S. Cl. .................. 357/23.4; 357/38; 357/86
[58] Field of Search .................. 357/23.4, 37, 38, 20, 357/86

[56] References Cited

U.S. PATENT DOCUMENTS 4,072,975 2/1978 Ishitani .................. 357/23.4
4,612,565 9/1986 Shimizu et al. .................. 357/59 I X
4,641,162 2/1987 Yilmaz .................. 357/23.4

OTHER PUBLICATIONS

Sze, S. M., *Semiconductor Devices: Physics & Technology*, John Wiley, 1985, p. 205.
Chang et al., "25 AMP, 500 Volt Insulated Gate Transistors", 1983 IEEE IEDM, pp. 83–86.
Sze, S. M., *Semiconductor Devices, Physics and Technology*, John Wiley, 1985, p. 483.

*Primary Examiner*—Andrew J. James
*Assistant Examiner*—Sara W. Crane
*Attorney, Agent, or Firm*—Oblon, Spivak, McClelland, Maier & Neustadt

[57] ABSTRACT

A conductivity modulated MOSFET, having a semiconductor substrate of a first conductivity type, a semiconductor layer of a second conductivity type formed on the semiconductor substrate and having a high resistance, a base layer of the first conductivity type formed in the semiconductor layer, a source layer of the second conductivity type formed in the base layer, a gate electrode formed on a gate insulating film which is formed on a channel region, the channel region being formed in a surface of the base layer between the semiconductor layer and the source layer, a source electrode ohmic-contacting the source layer and the base layer, and a drain electrode formed on the surface of the semiconductor substrate opposite to the semiconductor layer, characterized in that the conductivity modulated MOSFET has a saturation current smaller than a latch-up current when a predetermined gate voltage is applied to the gate electrode.

11 Claims, 12 Drawing Sheets

F I G. 19
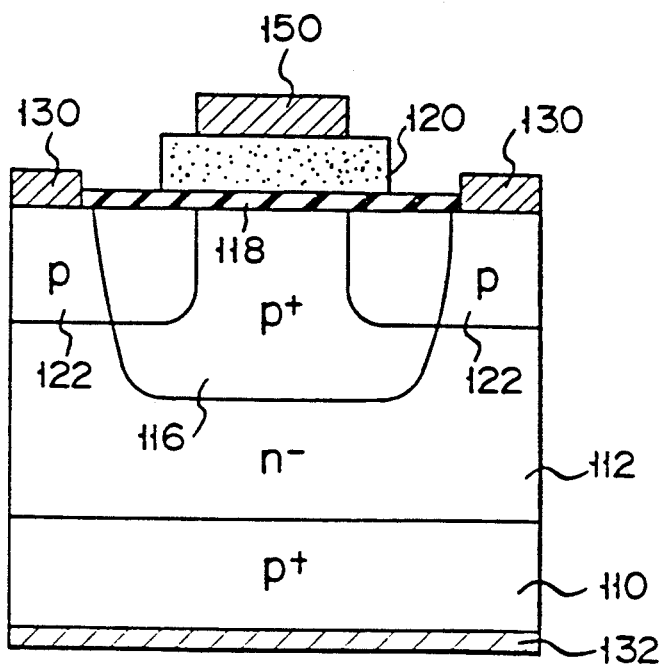
F I G. 20
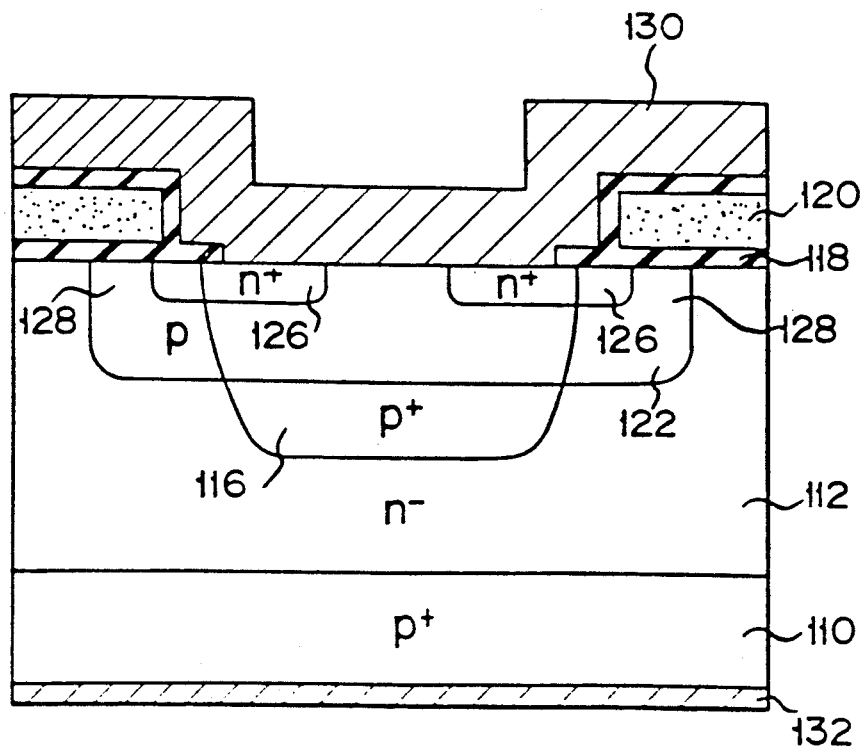

CONDUCTIVITY MODULATED MOSFET

This is a continuation of Ser. No. 07/532,366 filed June 4, 1990, now abandoned, which was a continuation of Ser. No. 07/249,822 filed Sept. 27, 1988, now abandoned, which was a continuation of Ser. No. 07/116,357 filed Nov. 4, 1987, now U.S. Pat. No. 4,881,120, which was a continuation of Ser. No. 07/019,337 filed Feb. 26, 1987, now U.S. Pat. No. 4,782,372, which was a continuation of Ser. No. 06/738,188 filed May 28, 1985, now U.S. Pat. No. 4,672,407.

BACKGROUND OF THE INVENTION

The present invention relates to a conductivity modulated MOSFET.

A conductivity modulated MOSFET has a drain region whose conductivity type is opposite to that of a source region of a normal power MOSFET. Typical examples of conventional conductivity modulated MOSFETs are described by M. F. Chang et al., "25 AMP, 500 Volt Insulated Gate Transistors", 1983 IEEE IEDM Technical Digest pp. 83–86 and by A. M. Goodman et al., "Improved COMFETS with Fast Swtiching Speed and High-current Capability", 1983 IEEE IEDM Technical Digest pp. 79–82.

Such a conductivity modulated MOSFET has a parasitic p-n-p-n thyristor. When the parasitic thyristor is turned on, the MOSFET cannot be turned off even if a voltage across the gate and source thereof is zero. The element is often damaged. The parasitic thyristor is turned on since holes injected from the p$^+$-type drain layer into an n$^-$-type drain region pass into the source electrode through a p-type base layer. In other words, when a hole current flows through the p-type base layer and a voltage drop across a resistor of the base layer immediately under the source layer exceeds 0.7 V, electrons are injected from the source layer to turn on the parasitic thyristor. This phenomenon is described in the above-mentioned "25 AMP, 500 Volt Insulated Gate Transistors".

In order to prevent such a latch-up phenomenon, various proposals have been made including the two papers described above. The present invention, however, has been made to prevent the latch-up phenomenon from another viewpoint.

SUMMARY OF THE INVENTION

It is an object of the present invention to provide a conductivity modulate MOSFET which prevents a latch-up phenomenon caused by a parasitic thyristor.

In order to achieve the above object of the present invention, there is provided a conductivity modulated MOSFET, comprising: a semiconductor substrate of a first conductivity type which has first and second surfaces; a high resistance semiconductor layer of a second conductivity type which is formed on the first surface of the semiconductor substrate and has a high resistance, the high resistance semiconductor layer being provided with a third surface contacting the first surface and a fourth surface opposite to the third surface; a base layer of the first conductivity type which is formed in the fourth surface of the high resistance semiconductor layer; a source layer of the second conductivity type which is formed by diffusion in the base layer; a gate electrode form on a gate insulating film which is formed on a channel region, the channel region being formed in a surface of the base. layer between the fourth surface of the high resistance semiconductor layer and the source layer; a source electrode ohmic-contacting the source layer and the base layer; and a drain electrode formed on the second surface of the semiconductor substrate, characterized in that the conductivity modulated MOSFET has a saturation current smaller than a latch-up current when a predetermined gate voltage is applied to the gate electrode.

With the above arrangement, the current flowing through the conductivity modulated MOSFET is always smaller than the latch-up current, thereby preventing the latch-up phenomeon in principle.

There are several methods for setting the saturation current of the conductivity modulated MOSFET to be smaller than the latch-up current. The following methods are included therein as will be described in detail with reference to the preferred embodiments.

(1) To satisfy $(W \cdot SG)/(T \cdot l \cdot d) < 1.46 \times 10^8$ where

W: total channel width within a 1 cm$^2$ unit area of an active region, in $\mu$m SG: an area of a portion of the high resistance region formed directly beneath the gate electrode and contacting the gate insulating film within the 1 cm$^2$ unit area of the active region, in $\mu$m$^2$ T: a perimeter of the base layer in contact with the high-resistance layer, i.e., the perimeter of SG, within the 1 cm$^2$ unit area of the active region, in $\mu$m l: a channel length ($\mu$m) and d: a thickness ($\mu$m) of the gate insulating film.

(2) To satisfy $(W \cdot SG)/(T \cdot l \cdot d) < 1.1 \times 10^8$ where W, SG, T, l and d are as above defined W: the overall channel width ($\mu$m) per unit area (1 cm$^2$) of an effective element region SG: an area ($\mu$m$^2$) of a portion of the gate electrode which is formed immediately on the high resistance semiconductor layer within the unit area T: an overall circumferential length ($\mu$m) of the base layer within the unit area l: a channel length ($\mu$m) and d: a thickness ($\mu$m) of the gate insulating film.

(3) To form portions which are not or can hardly be subjected to MOSFET operation between the source electrode and the fourth surface of the high resistance semiconductor layer, the portions which are not subjected to MOSFET operation are formed as portions without the source layer along the direction of the channel width, thereby forming a hole current path from the drain to the source electrode without being through a portion under the source layer.

(4) To surround the fourth surface of the high resistance semiconductor layer by the base layer to constitute an island region.

BRIEF DESCRIPTION OF THE DRAWINGS

Other objects and advantages will be apparent from the following description taken in conjunction with the accompanying drawings, in which:

FIG. 19 is a sectional view of the MOSFET taken along the line IXX—IXX of FIG. 17;

FIG. 20 is a sectional view of the MOSFET taken along the line XX—XX of FIG. 17;

DETAILED DESCRIPTION OF THE PREFERRED EMBODIMENTS

Figure 1:
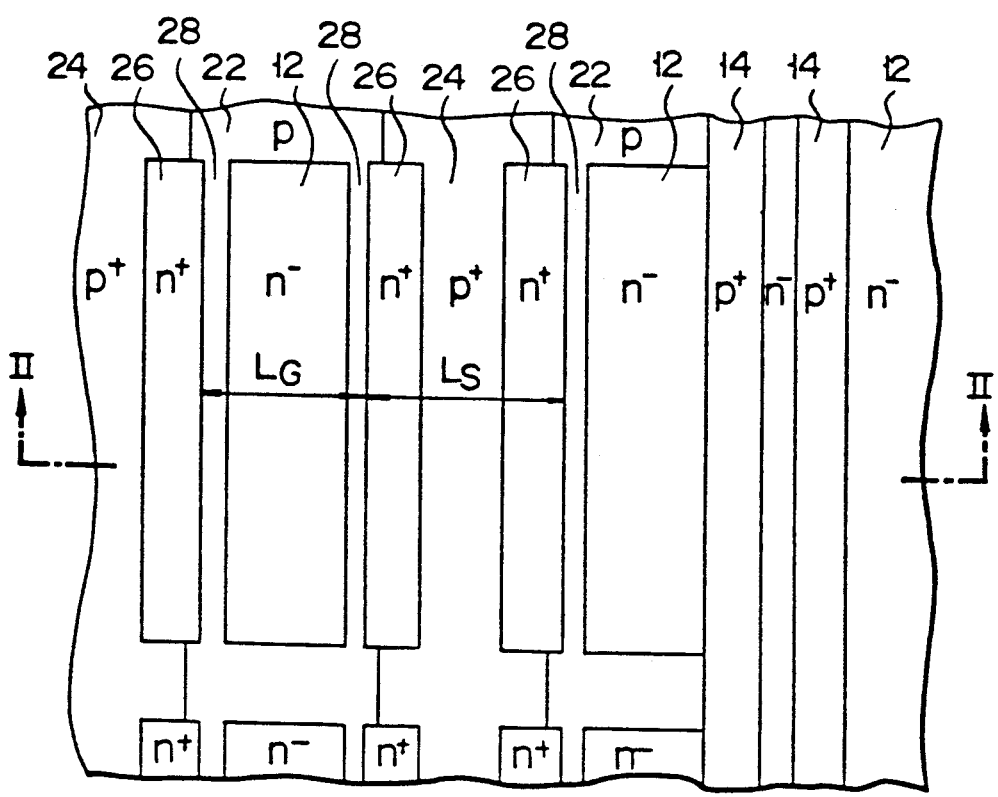
FIG. 1 is a plan view of a conductivity modulated MOSFET according to a first embodiment of the present invention.

It is very important to increase a current density of a conductivity modulated MOSFET when a parasitic thyristor latches up. For this reason, in a conventional conductivity modulated MOSFET, a great deal of effort has been made to increase this latch-up current density. However, a specific value of the latch-up current density is not proposed. The present inventors experimentally found that the element was not substantially latched up when the latch-up current was larger than the saturation current of the MOSFET in the state that a predetermined gate voltage was applied to set an ON resistance of the conductivity modulated MOSFET to be a sufficiently small value.

The meaning that the latch-up current of the MOSFET is larger than the saturation current thereof is defined by the following explanation. A MOSFET is directly connected to a 100-V constant voltage source at a temperature of 25° C. A gate voltage VG is increased from 0 V to $10^2 \cdot d$ (V) (where d is the thickness ($\mu$m) of the gate oxide film) within 200 nsec, and a current flows through the MOSFET for 10 $\mu$sec to obtain a forward voltage drop of about 100 V. Thereafter, when the gate voltage is set at 0 V or less within 200 nsec, the MOSFET is not latched up but turned off, thus defining the fact that the latch-up current is larger than the saturation current. It should be noted that a resistor of 10-$\Omega$ or more cannot be inserted between the gate circuit and the gate terminal of the MOSFET in order to increase the gate voltage from 0 V to $10^2 \cdot d$ (V) within 200 nsec. A latch-up current value described hereinafter is measured including resistance load when the gate voltage is decreased from a predetermined value VG to 0 V or less within 200 nsec as the above description. This latch-up current value is different from that of M. F. Chang et al. which is obtained by inserting a resistance between a gate circuit and an element or between the gate and source terminals.

A conductivity modulated MOSFET according to a first embodiment of the present invention will be described with reference to FIGS. 1 to 3.

A high-resistance n$^-$-type layer 12 having an impurity concentration of $2 \times 10^{14}$/cm$^3$ is epitaxially grown on a p$^+$-type Si substrate 10. Several p$^+$-type guard ring layers 14 are formed to surround an active region so as to assure a high withstand voltage.

The active region is defined as the region including the base and source layers contacting the source electrode and the high resistance layer under the gate electrode. In other words, the active region excludes guard rings, bonding pads and portions of polycrystalline silicon regions on which a metal gate electrode is formed. At the same time, a deep (about 10 $\mu$m) p$^+$-type layer 16 serving as part of the base diffusion layer is formed. Thereafter, a gate oxide film 18 is formed to a thickness of 1,000 Å and then a gate electrode 20 of a polycrystalline silicon film having a thickness of 5000 Å is formed on the gate oxide film 18. A p-type base diffusion layer 22 is formed using the gate electrode 20 as a mask. A shallow p$^+$-type layer 24 is formed in the layer 22. An n$^+$-type source diffusion implantation of As (arsenic) using the electrode 20 as a mask. A channel region 28 is formed under the gate electrode 20, and thereafter a CVD-SiO$_2$ film is formed to cover the entire surface. A contact hole is formed in this CVD-SiO$_2$ film, and a source electrode 30 is formed within the contact hole. A drain electrode 32 is formed on the lower surface of the substrate 10. The p-type base diffusion layer 22 has a depth of 7 $\mu$m, and the source diffusion layer 26 has a depth of 0.2 $\mu$m. A width LG of a portion of the gate electrode 20 immediately over the high-resistance n$^-$-type layer 12 is 30 $\mu$m, and a width LS of the source region is 45 $\mu$m. The source comprises a stripe shape, as shown in FIG. 1.

Figure 2:
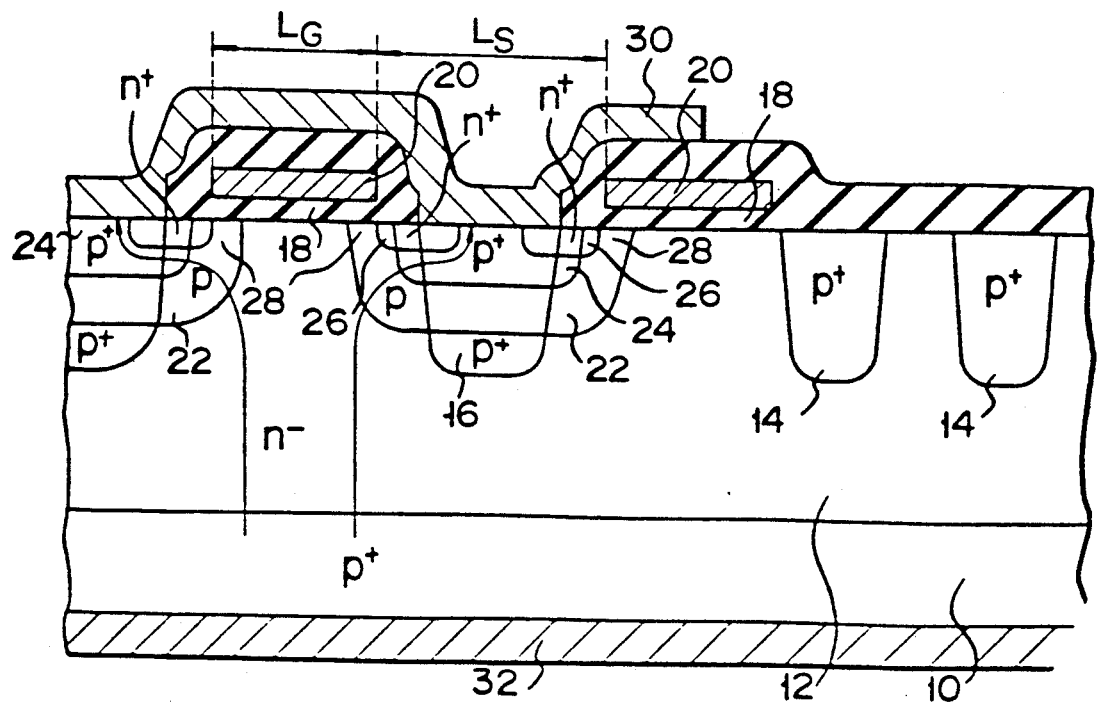
FIG. 2 is a sectional view of the MOSFET taken along the line II—II of FIG. 1.

The conductivity modulated MOSFET comprises a plurality of unit elements as shown in FIGS. 1 and 2. The unit elements are arranged orderly, i.e., at regular intervals.

The process for deriving the mathematical expressions for the design parameters in this embodiment will be described. Hereinafter it will be assumed that the active region has an area of 1 cm$^2$. First, a current for latching up the conductivity modulated MOSFET is obtained. When the widths LS [$\mu$m] and LG [$\mu$m] (FIGS. 1 and 2) of the source region and the gate electrode are sufficiently small, a substantially uniform hole current flows through an element. When the parasitic thyristor is latched up, the current density is given as $JL(A/\mu m^2)$. In addition, when the area of the high resistance semiconductor layer 12 formed immediately beneath the gate electrode 20 within 1 cm² of the active region is given as SG [$\mu m^2$], a current I [A] flowing into the high-resistance semiconductor layer 12 under the portion of the gate electrode 20 within 1 cm² of the active region is given as follows:

$$I = SG \cdot JL \quad (1)$$

The hole current in the total current given by equation (1) finally flows into the layer 22 in the direction of the arrow indicated in FIG. 2. Therefore, when the perimeter of the entire p-type base layer or layers 22 and 16, which contacts the high resistance semiconductor layers 12 within 1 cm² of the active region is given as T($\mu m$), a current Ib flowing per unit perimeter [A/cm] of p-type diffusion layer 22 is defined below:

$$Ib = SG \cdot JL \cdot \alpha P / T \quad (2)$$

where $\alpha P$ is the ratio of the hole current to the total current. When an average resistance from the unit perimeter of the base diffusion layer 22 to the source electrode 30 is given as Rb$\Omega$, a voltage drop by the current Ib in the base diffusion layer 22 is:

$$V = Rb \cdot SG \cdot JL \cdot \alpha P / T \quad (3)$$

When the voltage V[V] exceeds a built-in voltage Vbi[V] at the junction between the source and the base, the parasitic thyristor is latched up. Substitution of Vbi into V in equation (3) yields equation (4) below:

$$JL = Vbi \cdot T / (Rb \cdot SG) \quad (4)$$

Since the channel disappears in the transient state during switching and the entire current is regarded as the hole current, condition $\alpha P = 1$ is established in equation (4). UL in equation (4) refers to the current flowing through the active region, because the active region is defined as having an area of 1 cm².

When a current flowing through the active region in the saturation region is given as JS[A], JS is expressed from the MOSFET theory as follows, $$JS = (W/2l)\mu Ci(VG - VT)^2 / (1 - \alpha P) \quad (5)$$

where

W: the channel width [$\mu m$] within 1 cm² of the active region
l: the channel [$\mu m$] length
$\mu$: the electron mobility [cm²/sec V]
Ci: the gate capacitance [Q/V] within 1 cm² of the active region, and
VT: the threshold voltage [V].

When the current JL is larger than the current JS, the parasitic thyristor will not be latched up in principle. Therefore, $$Vbi \cdot T/(Rb \cdot SG) > (W/2l)\mu Ci(VG - VT)^2/(1 - \alpha P) \quad (6)$$

When the dielectric constant of the gate insulating film 18 is $\epsilon$ and its thickness is d [$\mu m$], equation (6) can be rewritten as follows since condition $Ci = \epsilon/d$ is established:

$$W \cdot SG/(T \cdot l \cdot d) > 2Vbi(1 - \alpha P)/Rb \cdot \mu \cdot \epsilon (VG - VT)^2 \quad (7)$$

The values in the right-hand side of equation (7) are constant except for VG and Rb since $\alpha p$ is sufficiently smaller than 1. The voltage VG is set at about 15 V which can normally drive an IC. A minimum value of the attainable resistance Rb is limited in practice. Therefore, the value given by the right-hand side of equation (7) can be regarded as a constant. When this constant is given as AM, $$W \cdot SG/(T \cdot l \cdot d) > AM \quad (8)$$

When equation (8) is satisfied, a maximum current at a gate voltage of 15 V will not latch up the parasitic thyristor. Therefore, this conductivity modulated MOSFET will not be latched up and be turned off in principle.

However, in practice, when a voltage drop of 100 V or more across the element is produced or an excessive current flows therethrough, the element temperature is increased to break down the element. Even in this case, if the left-hand side of equation (8) is sufficiently small, breakdown will not easily occur. This will be described with reference to data of FIG. 3.

Figure 3:
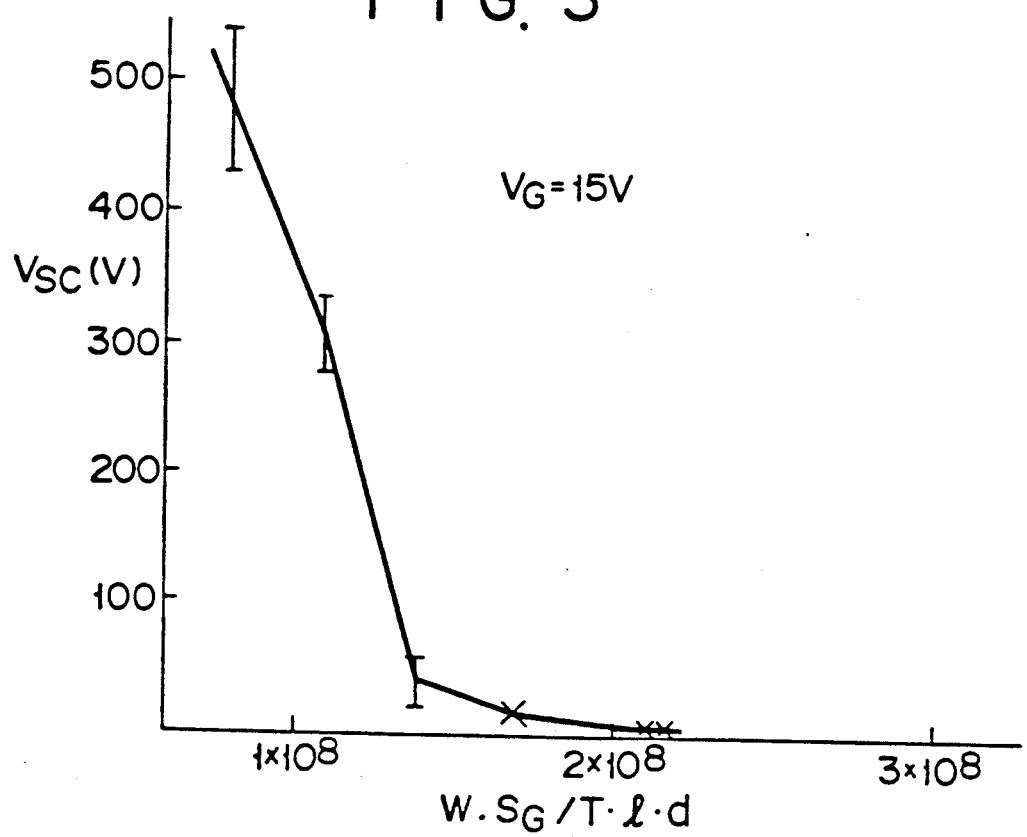
FIG. 3 is a graph showing a relationship between VSC (a voltage applied to an element) and W·SG/T·l·d (A 50 $\Omega$ resistor was inserted between the gate terminal and the gate circuit), where W, SG, T, l and d are as above defined.

In FIG. 3, it is explained that, at the point of VSC (a voltage applied to the element)=300 V along the ordinate, the element is broken down even if a current flows in the element for 10 $\mu s$ after the element is connected to a 300-V constant voltage source at the gage voltage VG=15 V and case temperature=25° C. Of course, a voltage drop of the element in this case is the same 300 V as a 300 V voltage source. A voltage source up to 300 V can be used for a 600-V element. When the voltage VSC exceeds 300 V, the element will not be broken down at least for 10 $\mu s$ even if an external load is short-circuited and then the power source voltage is directly applied to a system which uses this element. The breakdown of the element will be prevented if the element is turned off during the 10 $\mu s$. Referring to FIG. 3, in order to prevent the element from breaking down even if a current flows for 10 $\mu s$ at a voltage of 300 V while the gate voltage VG is set at 15 V, the following condition must be satisfied:

$$W \cdot SG/(T \cdot l \cdot d) > 1.1 \times 10^8 \quad (9)$$

The value given by the above condition is a nondimensional parameter.

In the conductivity modulated MOSFET according to the first embodiment shown in FIGS. 1 and 2, $SG = 30/(30+45) \times 1 \text{ cm}^2 = 0.4 \text{ (cm}^2)$, because the channel length is negligible. The length T of the p-type base diffusion layer is substantially equal to the channel width W, because the width of the high-resistance semiconductor layer 12 is small. In addition, since the channel length l is about 5.5 $\mu m$, the following results are obtained.

$$W \cdot SG/(T \cdot l \cdot d) = SG/(l \cdot d)$$
$$= 7.3 \times 10^7$$

In the above embodiment, when a voltage of 500 V is applied between the drain and the source while a voltage of 15 V is applied to the gate, a current of 300 A/cm² flows through the element. In this case, the element will not be broken down for 10 μs. The element has a static breakdown voltage of 600 V and is normally used at a power source voltage of 300 V or less. Therefore, since the element is not broken down at the power source voltage of 500 V in the above embodiment, the electrical characteristics of the element can be regarded to be sufficient.

Similarly, in an element having a static breakdown voltage of 1,200 V, the voltage VSC is set to be 600 V. As is evident from the above description, the parameters SG, T and W are each defined in relation to the predetermined unit area of the active region. In particular, SG is defined as a value obtained by dividing the area [μm$^2$] of the high-resistance layer over which the gate electrode is formed in the active region by the area [cm$^2$] of the active region and multiplying by 1 cm$^2$. T is defined as a value calculated by dividing the perimeter [μm] of the base layer in contact with the high-resistance layer in the active region by the area [cm$^2$] of the active region and multiplying by 1 cm$^2$. W is defined as a value obtained by dividing the total channel width [μm] in the active region by the area [cm$^2$] of the active region and multiplying by 1 cm$^2$. In this way, the parameters SG, T and W are normalized with respect to the unit area of the active region, with 1 cm$^2$ being arbitrarily chosen as the unit area.

If the active region is exactly 1 cm$^2$, SG, W and T are the values included in the active region. If the active region is different from 1 cm$^2$, SG, W and T are to be normalized into values for 1 cm$^2$. To obtain suitable normalized values of SG, T and W, these parameters are calculated as follows:

$$SG = \frac{SG'}{Sa} \times 1 \text{ cm}^2$$

$$T = \frac{T'}{Sa} \times 1 \text{ cm}^2$$

$$W = \frac{W'}{Sa} \times 1 \text{ cm}^2$$

wherein Sa is an area [cm$^2$] of the active region, SG' the area [μm] of the high-resistance layer over which the gate electrode is formed in the active region, T' the perimeter [μm] of the base layer in contact with the high-resistance layer in the active region, and W' the total channel width [μm] in the active region.

Figure 4:
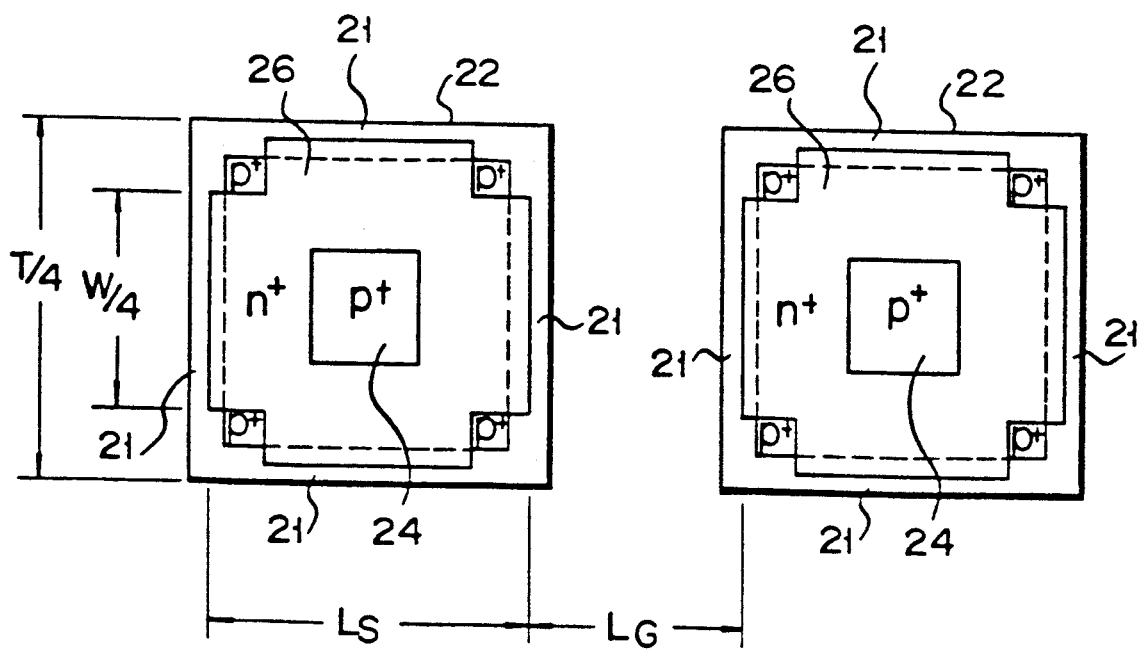
FIG. 4 is a plan view of a conductivity modulated MOSFET according to a second embodiment of the present invention.

FIG. 4 shows a diffusion layer pattern according to a second embodiment. The pattern of the second embodiment is substantially the same as that of the first embodiment except that a p-type base diffusion 22 comprises a plurality of island regions, and the manufacturing process for the second embodiment is the same as that of the first embodiment. The same reference numerals as in the second embodiment denote the same parts as in the first embodiment. In the second embodiment, four corners of an n$^+$-type source region 26 are omitted so as not to entirely cover the peripheral portion of p-type base diffusion layer 22. The length T of the layer 22 differs from the width W to obtain a ratio W/T = 0.8. In addition, conditions LG = 20 μm and LS = 45 μm are given. Therefore, $$W \cdot SG/(T \cdot l \cdot d) = 7.6 \times 10^7$$

substantially the same characteristics as in the first embodiment can be obtained in the second embodiment.

In the second embodiment, the unit element has unit area (1 cm$^2$).

In the above embodiment, the gate voltage is set at 15 V. However, when the ambient temperature of the element is kept at 25° C., the gate voltage may be 10 V to set the latch-up current to be larger than the saturation current if condition (10) below is satisfied:

$$W \cdot SG/(T \cdot l \cdot d) < 1.46 \times 10^7 \quad (10)$$

In the conductivity modulated MOSFET satisfying condition (10), when heavy metal diffusion or electron beam irradiation is performed in the high-resistance n$^-$-type semiconductor layer 12, i.e., when a lifetime killer is injected therein to shorten the carrier lifetime, the saturation current can be set small. In this case, even if a temperature rise occurs, the latch-up phenomenon of the MOSFET can be prevented.

A conductivity modulated MOSFET according to a third embodiment of the present invention will be described with reference to FIGS. 5 and 6.

According to the third embodiment, a base stripe layer is formed in the substrate. The above MOSFET will be described with reference to the steps of a method of fabricating thereof. A p$^+$-type Si substrate 10 is prepared. An n$^-$-type layer 12 having a low impurity concentration and a resistivity of 50 Ωcm or more is epitaxially formed to a thickness of about 100 μm on the substrate 10. The surface of layer 12 is oxidized to form a gate oxide film 18. A gate electrode 20 of a polycrystalline silicon film having a thickness of 5,000 Å is formed on the gate oxide film 18. Thereafter, boron is implanted using the gate electrode 20 as a mask and is diffused to a depth of 8 μm to form a p-type base layer 22. An oxide pattern (not shown) having a hole for forming the source layer is formed in a window surrounded by the gate electrode 20, and As ions are implanted at a dose of 5×10$^{15}$/cm$^2$ using the oxide pattern and the electrode 20 as masks. The resultant structure is annealed to form an n$^+$-type source layer 26a. As is apparent from FIG. 5, the source layer 26a comprises a plurality of discrete island regions. Thereafter, a high-impurity p$^+$-type layer 24 is formed in the layer 22, and a source electrode 30 is formed to contact the p$^+$-type layer 24 and the n$^+$-type source layer 26a. A drain electrode 32 is formed by deposition of V—Ni—Au on the lower surface of the substrate 10. A channel region 28a and regions 40 are alternately formed in a region 28. The channel regions 28a are subjected to normal MOSFET operation. Regions 40 are not subjected to MOSFET operation since the source layer is not present therein.

In the MOSFET in this embodiment, when the element is turned on, components flowing through the portions 40 among the hole current components injected from the n-type layer 12 under the gate electrode 20 to the p-type base layer 22, do not flow under the source layer 26a but directly flow into the source electrode 30. Therefore, as compared with the conventional structure, the lateral resistance under the source layer can be effectively decreased, and the latch-up phenomenon does not occur up to a large current.

In the above embodiment, when the conductivity modulated MOSFET is designed to satisfy equations (9) or (10), the latch-up phenomenon can be further prevented.

Figure 5:
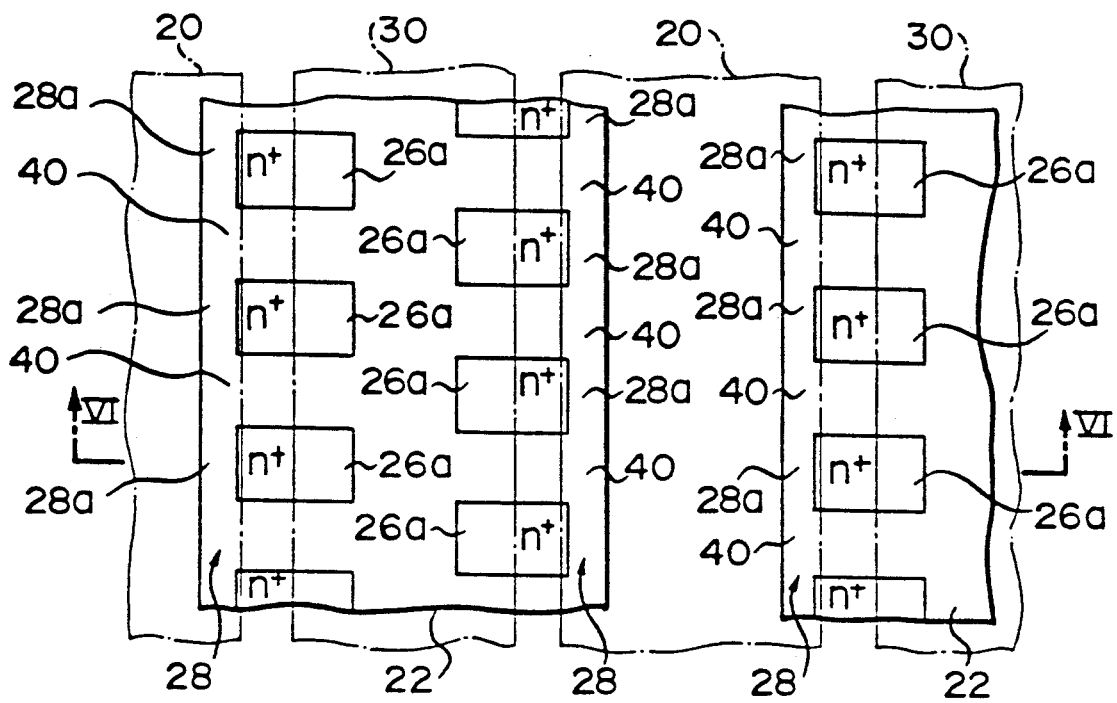
FIG. 5 is a plan view of a conductivity modulated MOSFET according to a third embodiment of the present invention.
Figure 6:
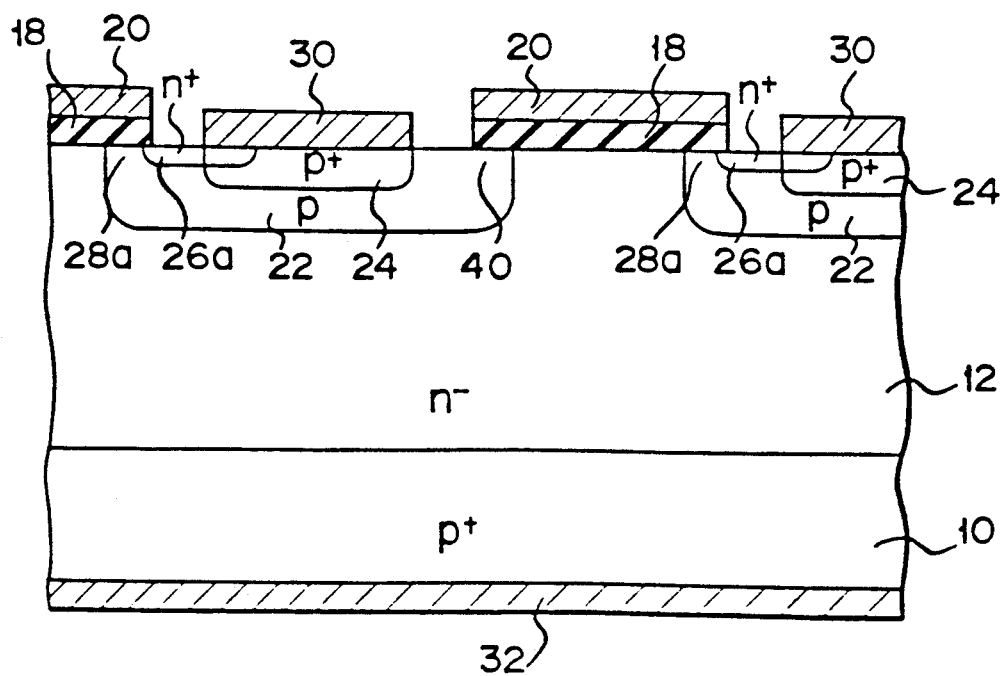
FIG. 6 is a sectional view of the MOSFET taken along the line VI—VI of FIG. 5.

Referring to FIGS. 5 and 6, a plurality of n$^+$-type source layers 26a are independent of the each other.

Figure 7:
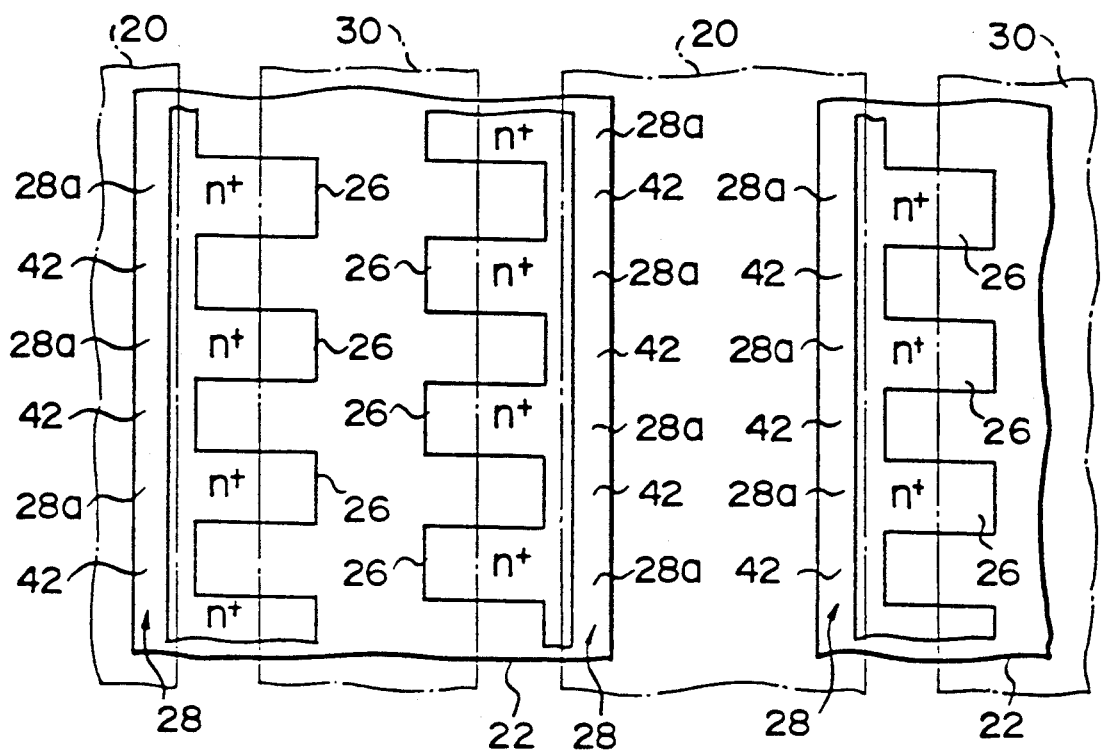
FIG. 7 is a plan view showing a modification of the conductivity modulated MOSFET shown in FIG. 5.

However, as shown in FIG. 7, n+-type source layers 26 may be commonly connected through a small width region. In this case, the width of the source layers at channel portions 42 is substantially small, so the same effect as in the above embodiment can be expected.

A conductivity modulated MOSFET according to a fourth embodiment of the present invention will be described with reference to FIGS. 8 and 9. The same reference numerals as in the fourth embodiment denote the same parts as in the previous embodiments, and a detailed description thereof will be omitted. According to the fourth embodiment, a p+-type layer 24 obtained by diffusion in a p-type base layer 22 has an indented edge pattern, i.e., the edges terminated at a channel region 28 and the edges terminated in source layers 26 are alternately formed. In other words, portions 44 with p+-type layers 24 are alternately formed in the region 28 and portions 28a without p+-type layers 24. The n+-type source layers 26 are continuously formed at two sides within the p-type base layer 22 in the same manner as in the conventional structure.

In this embodiment, the portions 44 have a higher threshold value than that of the channel regions 28a. In other words, the threshold value of the element is determined by the channel region 28a. More particularly, when an ON gate signal is supplied to a gate electrode 20, the channel region 28a is turned on upon MOSFET operation, while the portion 44 is kept off. In the ON state wherein conductivity modulation is occurred in the n−-type layer 12 and a large current flows, a hole current from the n−-type layer 12 also flows in the portion 44. However, since the p+-type layer 24 is formed entirely under the source layer 26 in the portion 44, a lateral resistance under the sourcelayer 26 is small as compared with that under the channel region 28a. Therefore, a voltage drop caused by a current flowing through the portion 44 is small. As a result, the latch-up phenomenon does not occur even if a large current flows in this embodiment.

Figure 8:
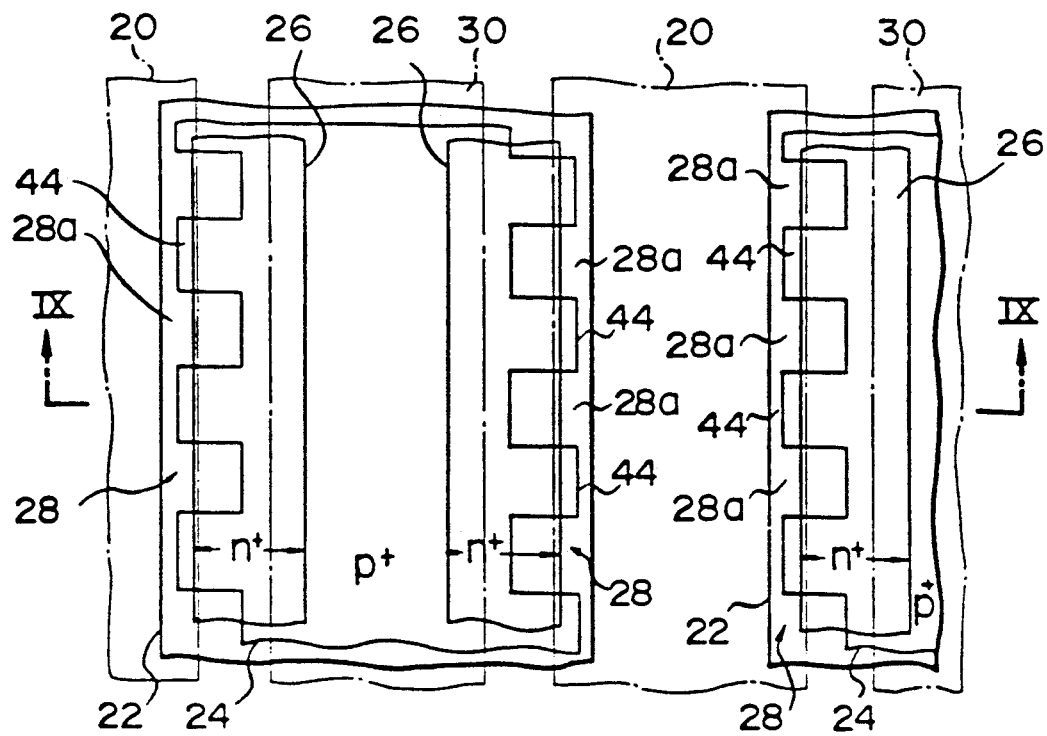
FIG. 8 is a plan view of a conductivity modulated MOSFET according to a fourth embodiment of the present invention.
Figure 9:
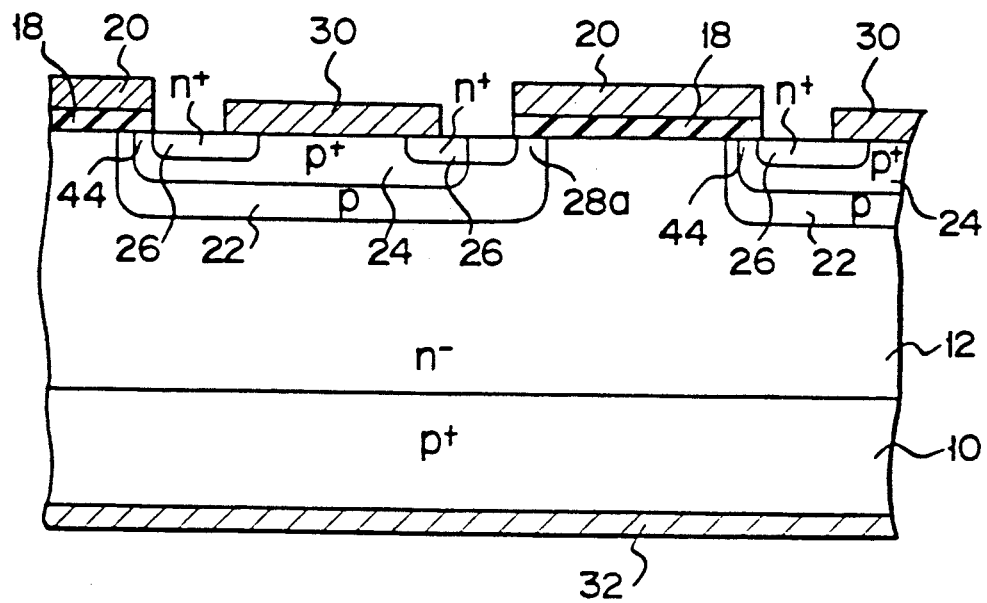
FIG. 9 is a sectional view of the MOSFET taken along the line IX—IX of FIG. 8.
Figure 10:
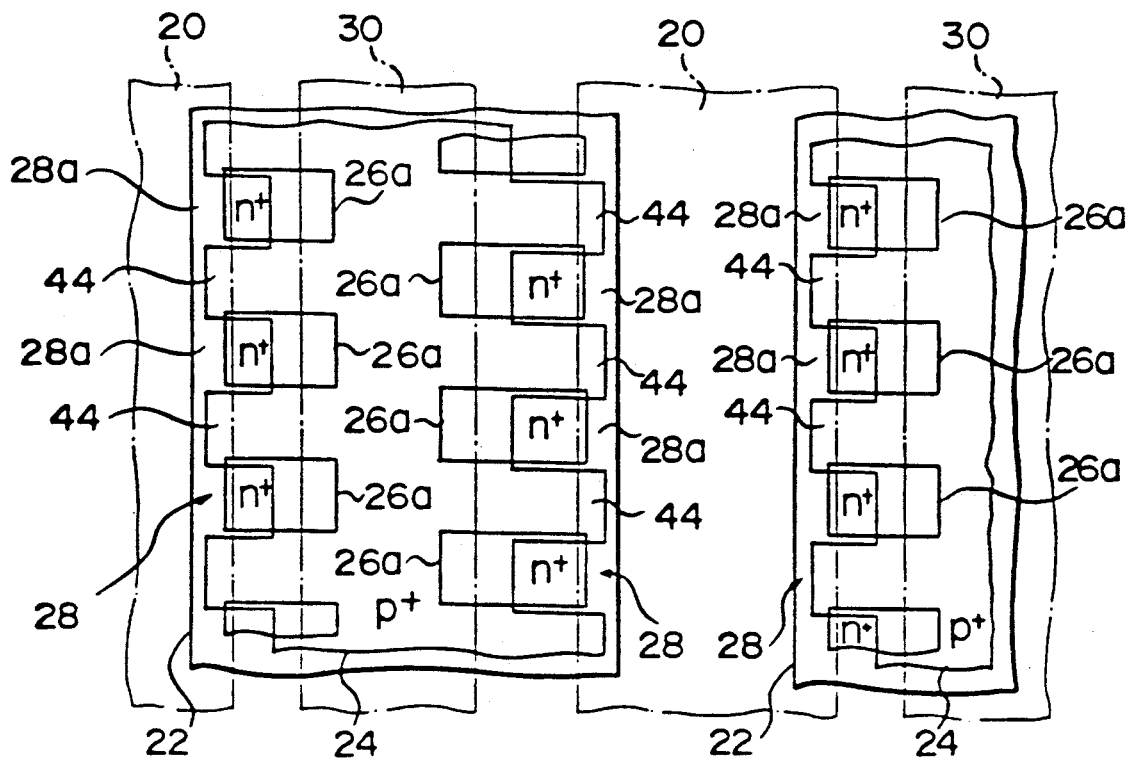
FIG. 10 is a plan view showing a modification of the conductivity modulated MOSFET of FIG. 8.

In the embodiment shown in FIG. 8, the n+-type source layers 26 are continuously formed at two sides of the p+-type base layer 22. However, when the layers 26 are replaced with discrete layers 26a on portion 28a in the same manner as in FIG. 5, i.e., when the embodiment of FIG. 5 is combined with that of FIG. 8, a further effect can be obtained. Its plan view is shown in FIG. 10. Therefore, a conductivity modulated MOSFET which is free from the latch-up phenomenon up to a current density of 1,500 A/cm² can be obtained.

Figure 11:
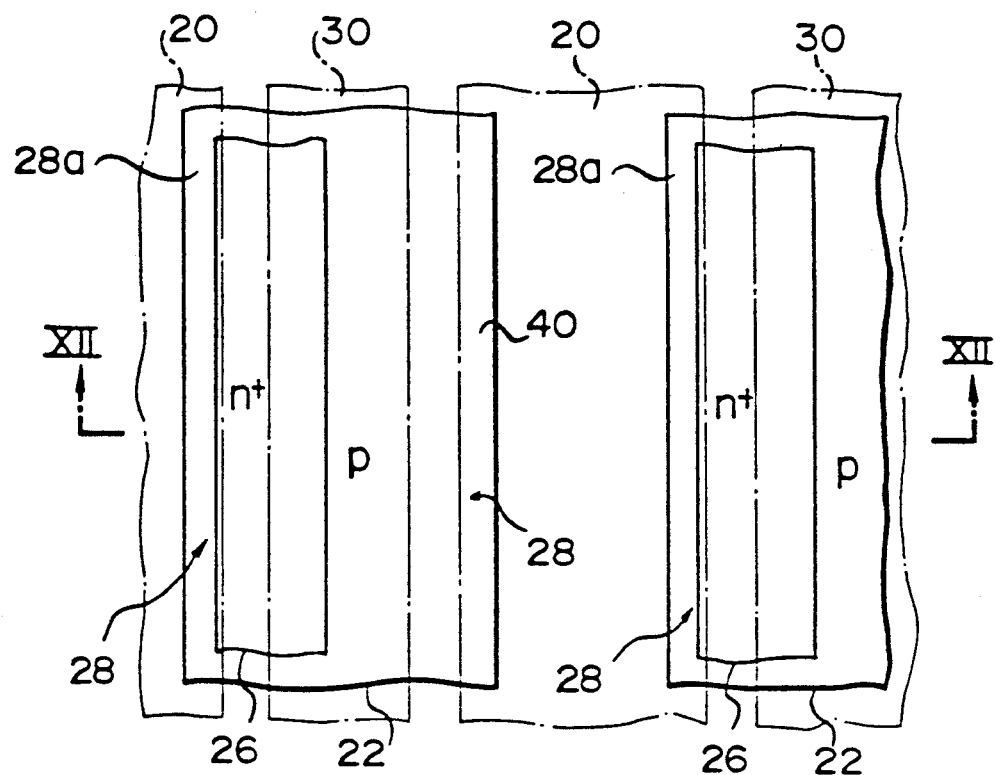
FIG. 11 is a plan view of a conductivity modulated MOSFET according to a fifth embodiment of the present invention.
Figure 12:
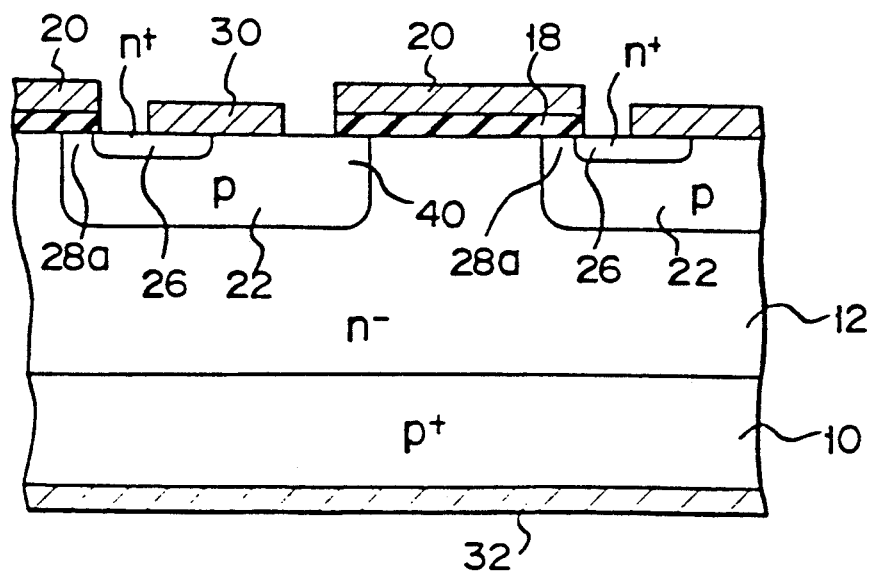
FIG. 12 is a sectional view of the MOSFET taken along the line XII—XII of FIG. 11.

A conductivity modulated MOSFET according to a fifth embodiment of the present invention will be described with reference to FIGS. 11 and 12. According to this embodiment, n+-type source layers 26 are continuously formed at one side of a p-type base layer 22 and are not formed at the other side thereof. In this case in the region 28, only regions 28a located at the source layer 26 are subjected to MOSFET operation, but regions 40 are not subjected to MOSFET operation. In the same manner as the previous embodiment, among the current components injected from the n−-type layer 12 to the p-type base layer 22, components passing through regions 40 directly flow into the source electrode 30 without flowing under the source layer 26, thereby effectively preventing the latch-up phenomenon.

In the above mentioned, the first conductivity type is p type, and the second conductivity type is n type. However, these conductivity types may be reversed to obtain the same effect as in the previous embodiments. In addition, the n−-type layer 12 may serve as a starting substrate, and the p+-type drain 10 may be formed by diffusion.

In the fourth and fifth embodiments, if conductivity modulation MOSFETS are fabricated to satisfy equations (9) or (10), a latch-up phenomenon can further be prevented.

Figure 13:
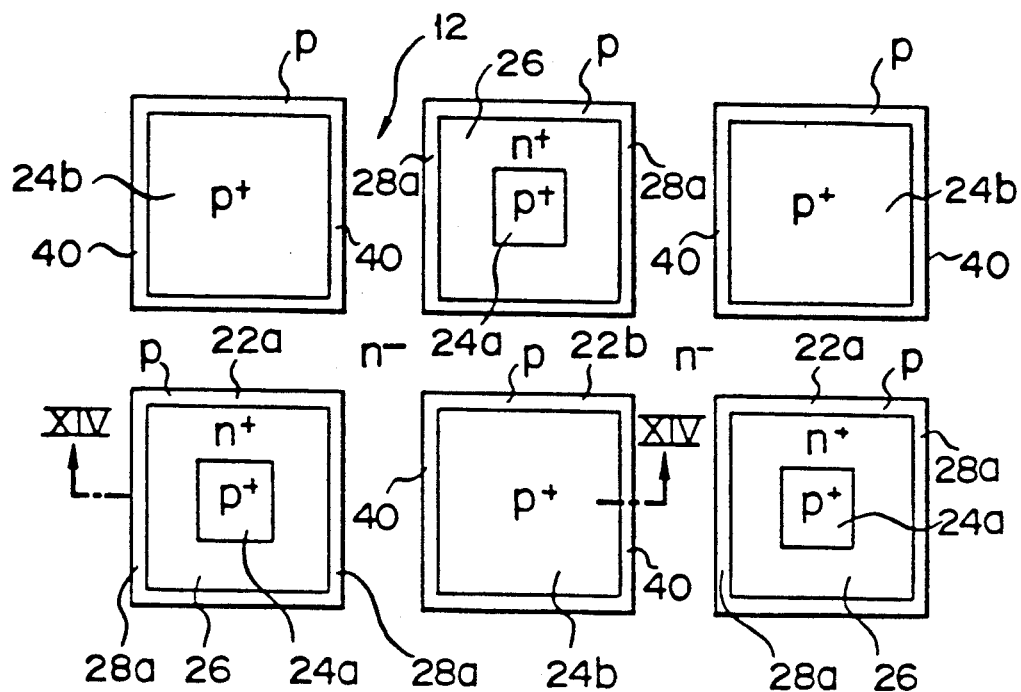
FIG. 13 is a plan view of a conductivity modulated MOSFET according to a sixth embodiment of the present invention.
Figure 14:
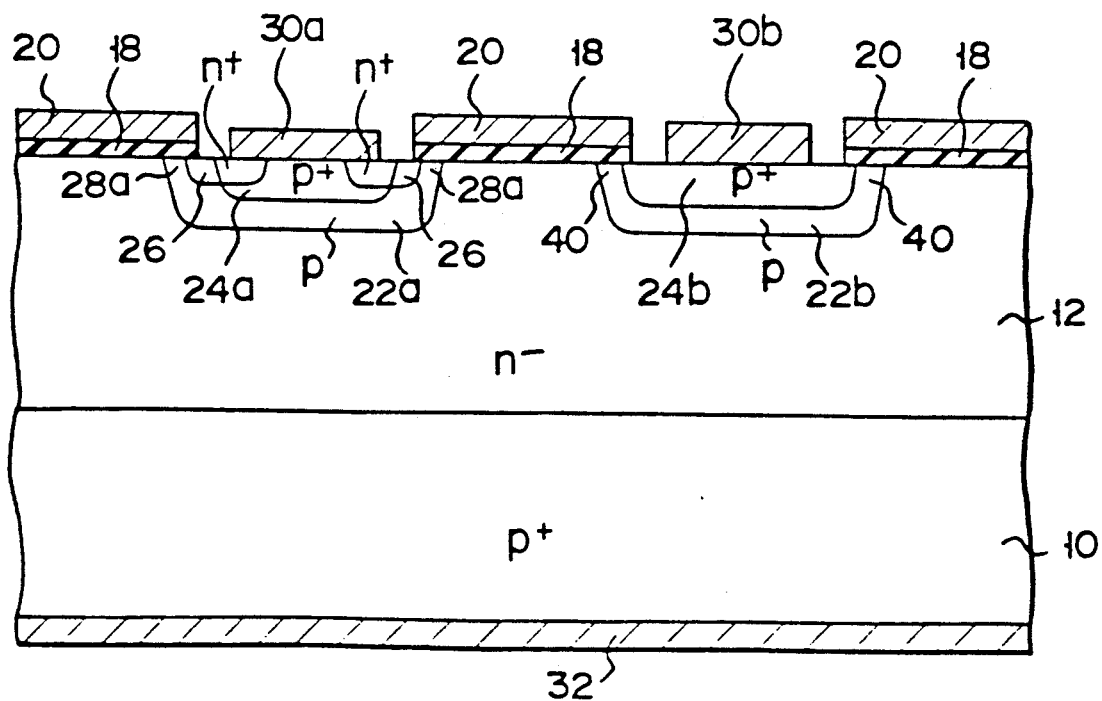
FIG. 14 is a sectional view of the MOSFET taken along the line XIV—XIV of FIG. 13.

A conductivity modulated MOSFET according to a sixth embodiment of the present invention will be described with reference to FIGS. 13 and 14. The same reference numerals as in the third embodiment denote the same parts in the sixth embodiment.

The fabrication steps of the MOSFET will be described. A p+-type Si substrate 10 is prepared. An n−-type layer 12 having a low impurity concentration and a resistivity of 50 Ωcm is epitaxially grown on the substrate 10 to a thickness of 100 μm. The surface of the layer 12 is oxidized to form a gate oxide film 18, and a gate electrode 20 of polysilicon having a thickness of 5,000 Å is formed on the film 18. Thereafter, boron is diffused to a depth of 4 μm, using the gate electrode 20 as a mask, to form p-type base layers 22a and 22b. An oxide pattern (not shown) having openings for forming the source layers is formed within windows formed by the gate electrode 20, and As ions are implanted using the oxide pattern and the gate electrode 20 as masks at a dose of $5 \times 10^{15}$/cm² to form the source layers. The resultant structure is annealed to form n+-type source layers 26. As is apparent from FIG. 14, the layers 26 are not formed in the base layers 22b. Thereafter, p+-type layers 24a and 24b are formed by diffusion in the p-type base layers 22a and 22b. Source electrodes 30a and 30b are formed to contact the layers 24a, 24b and 26. A drain electrode 32 is formed by deposition of V—Ni—Au on the lower surface of the substrate 10. A region 28 has regions 28a subjected to normal MOSFET operation and regions 40 which are not subjected to MOSFET operation in a given order.

In the MOSFET of this embodiment, among the hole current components injected from the n−-type layer 12 existing under the gate electrode 20 to the p-type base layers 22a, 22b, the components passing through the regions 40 directly flow into the source electrode 30b without flowing under the source layers 26. Since an amount of hole current along the lateral direction under the source layers is decreased as compared with the conventional structure, the latch-up phenomenon does not occur even if a large current flows therethrough.

Figure 15:
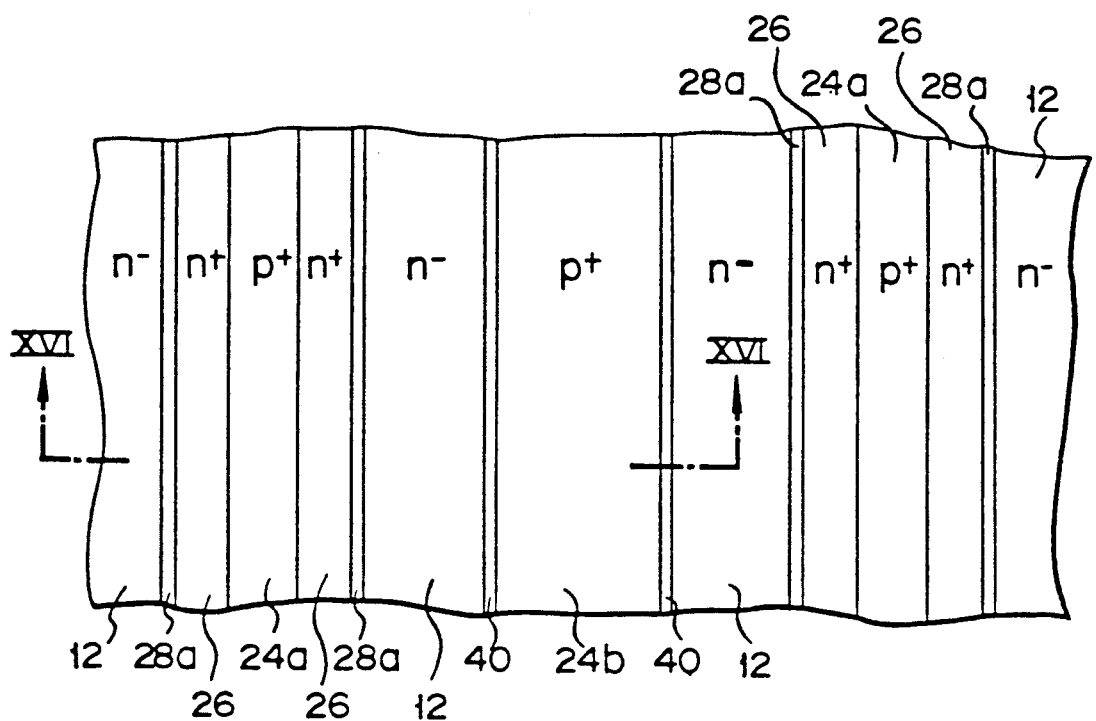
FIG. 15 is a plan view showing a modification of the conductivity modulated MOSFET of FIG. 14.
Figure 16:
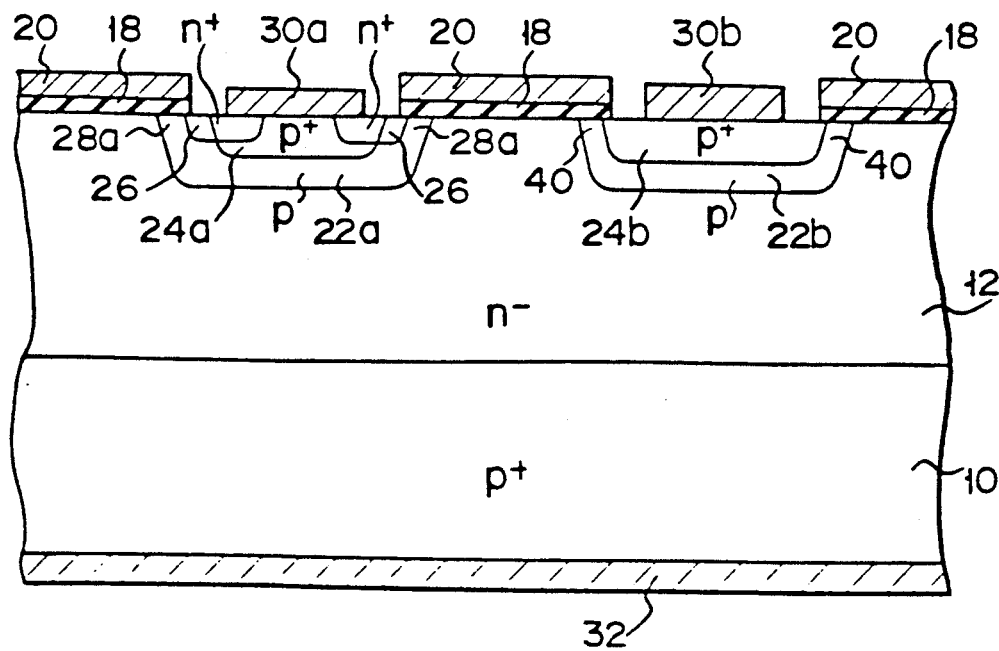
FIG. 16 is a sectional view of the MOSFET taken along the line XVI-XVI of FIG. 15.

In the above embodiment, the layers 26, 24a and 24b comprise island regions. However, as shown in FIGS. 15 and 16, island regions may be replaced with the stripe regions. Other arrangements of FIGS. 15 and 16 are the same as those of FIGS. 13 and 14. The same reference numerals as in FIGS. 15 and 16 denote the same parts as in FIGS. 13 and 14, and a detailed description thereof will be omitted.

When the conductivity modulated MOSFETs are formed to satisfy equations (9) or (10) in the sixth embodiment, the latch-up phenomenon is further prevented.

A conductivity modulated MOSFET according to a seventh embodiment of the present invention will be described with reference to FIGS. 17 to 20.

An n−-type high-resistance layer 112 is formed on a p+-type drain layer 110. P and p+-type base diffusion layers 122 and 116 are formed on the layer 112. An n+-type source diffusion layer 126 is formed in the layer 122. A gate electrode 120 (dotted region) of a polycrystalline silicon film is formed on a gate insulating film 118 which is provided on a channel region 128. The channel region 128 is provided in an exposed portion of the wafer between the layers 126 and 112. A source electrode 130 is formed to contact the layers 126 and 122. A drain electrode 132 is formed on the layer 110 as the lower surface of the wafer.

Figure 18:
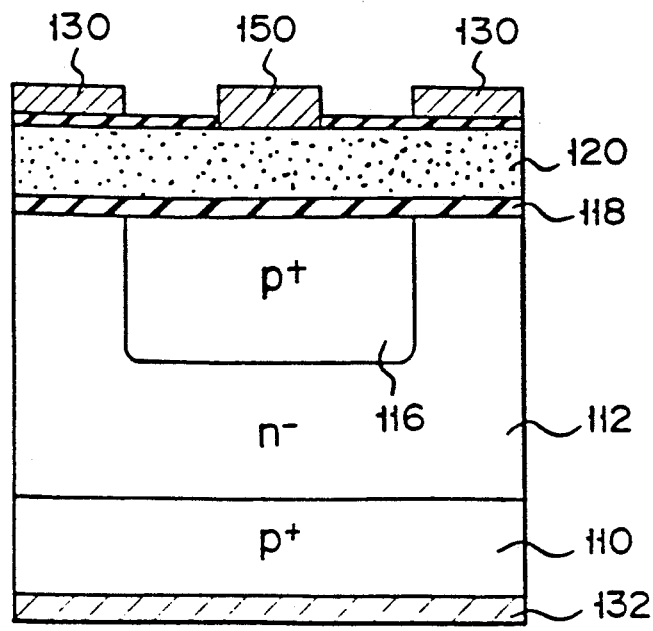
FIG. 18 is a sectional view of the MOSFET taken along the line XVIII—XVIII of FIG. 17.

The first feature of this embodiment lies in the fact that the high-resistance layers 112 under the gate electrodes 120 are formed to be rectangular and arranged in a matrix form, and channel regions 128 are arranged along the long sides of the rectangular layers 112. The reason by the layer 112 has a rectangular shape is that the width of the channel region 128 can be maximized in the rectangular island shape if the layer 112 is formed in an island fashion. The second feature lies in the fact that the rectangular portions of the layer 112 are completely surrounded by the layers 122 and 116 to constitute island portions. In other words, the gate electrode 120 is continuously formed on the surface of the substrate so as to cover the channel region 128 and the rectangular portions. Al stripe gate electrodes 150 are formed at positions where the source electrodes 130 are not present. As shown in FIGS. 18 to 20, a p+-type base diffusion layer 116 is formed under the source electrode 130 and the Al electrode 150 formed on the gate electrode 120. The rectangular portion of the high-resistance layer 112 is formed to be surrounded by the base diffusion layers 122 and 116.

In practice, the p+-type Si substrate (to be the drain layer 110) serves as the starting substrate. The layer 112 is epitaxially grown, and the resultant bulk substrate is used to sequentially perform impurity diffusion and electrode formation. However, the layer 112 may be used as a starting substrate.

Figure 17:
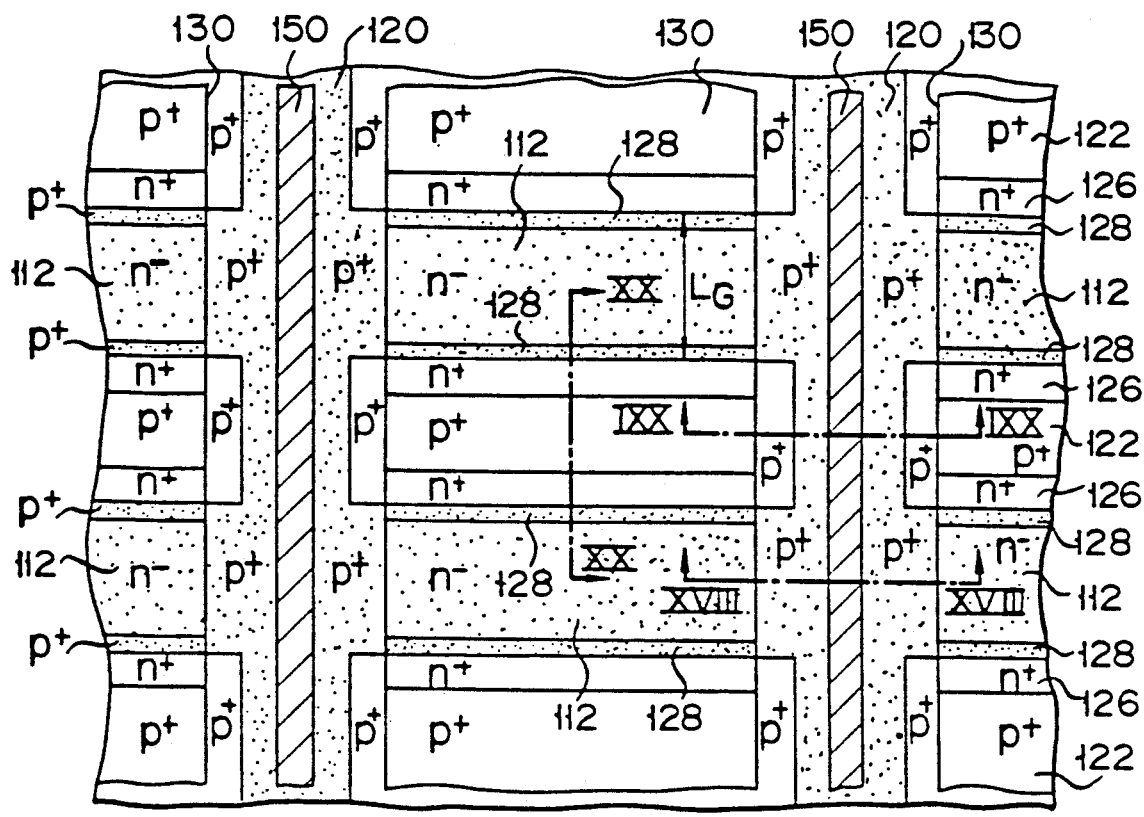
FIG. 17 is a plan view of a conductivity modulated MOSFET according to a seventh embodiment of the present invention.

As is apparent from FIG. 17, the sum of total width of the channel region 128 formed around the layer 112 existing under the gate electrode 120 is substantially the same as the perimeter of the p+-type base diffusion layer 116 which contacts to the high-resistance layer 112, because the channel width is larger than the channel length. For this reason, the spreading resistance caused by a difference between the lengths of the layer 116 and the channel region 128 is eliminated, and a base diffusion layer resistance under the source layer 126 can be small.

Only the gate electrode 120 of a polycrystalline silicon film is formed on the rectangular portion of the layer 112. In other words, no Al electrode 150 is formed thereon, so that the gate electrode width LG at this portion can be sufficiently small. The width LG is inversely proportional to the latch-up current density.

The fact that the drain current is inversely proportional to the width LG upon latching of the parasitic thyristor can be demonstrated, as in the equation (4), as follows. A substantially uniform current flows under the gate insulating film 118 and then into the p-type base layer 128, so that the following current IP flows per unit width of the channel region 128 under the gate insulating film 118:

$$IP = SG \cdot JP/T \quad (11)$$

where
JP: the hole current density [A/cm$^2$]

SG: the [μm$^2$] area of the gate electrode over the rectangular portion of the n$^-$-type high-resistance layer within 1 cm$^2$ of the active region and T: the perimeter [μm] of the p-type base diffusion layer, which contacts the high-resistance semiconductor layer 112 within 1 cm$^2$ of the active region, including p+-base diffusion layer.

The current IP flows into the base diffusion layer under the source diffusion layer. When a voltage drop caused by the resistance Rb under the source diffusion layer exceeds the built-in voltage Vbi between the base and the source, the parasitic thyristor is turned on. This condition is given as follows:

$$\begin{aligned} Vbi &= IP \cdot Rb \\ &= SG \cdot JP \cdot Rb/T \end{aligned} \quad (12)$$

where
Rb: the resistance [Ω] from the channel region to the p+-type contact per unit perimeter.

When the above equation is solved for JP, $$JP = Vbi \cdot T/SG \cdot Rb \quad (13)$$

The inversion layer of the channel disappears when the element is turned off. The total current comprises the hole current, so that the latch-up current density JL is JP/αP, where αP is the ratio of the hole current to the total current. As mentioned above, αP = 1, so that JL is given as follows:

$$JL = Vbi \cdot T/SG \cdot Rb \quad (14)$$

Figure 21:
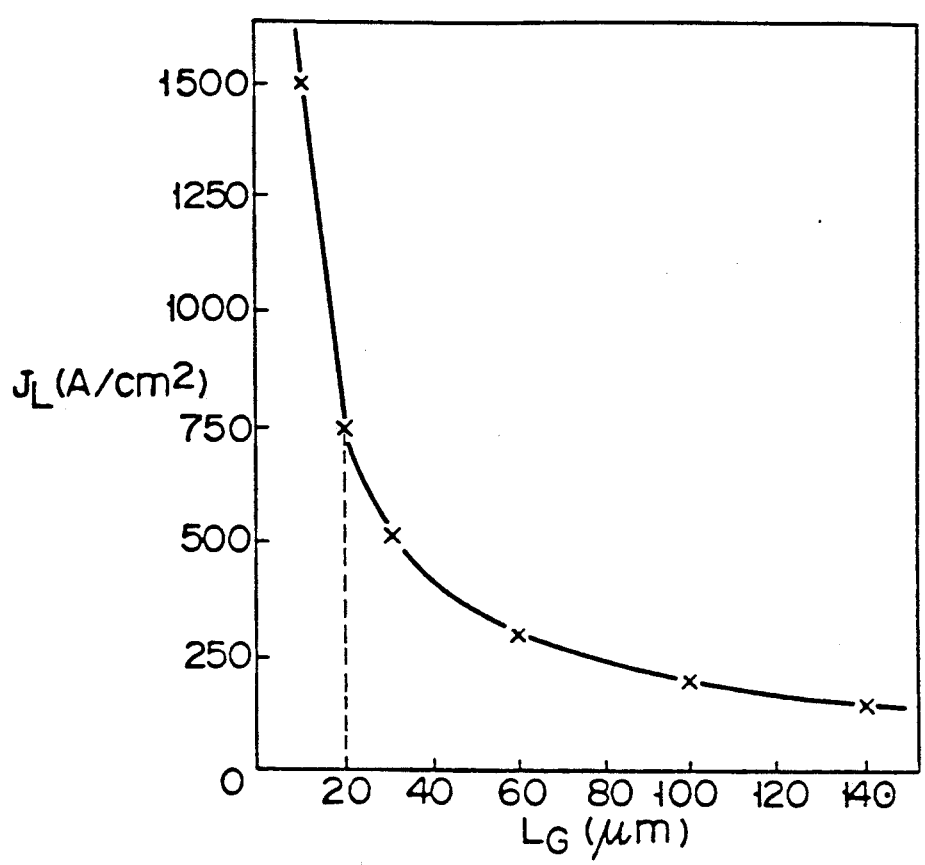
FIG. 21 is a graph showing the latch-up current density JL as a function of the gate width LG.

SG/T is substantially LG, so that JL is inversely proportional to LG/2. This result is apparent from the experimental data (FIG. 21) obtained by the present inventors.

In a sample MOSFET, LG = 20 μm is given. According to this embodiment, a latch-up current density of 750 A/cm$^2$ is obtained to effectively prevent the latch-up phenomenon. When the entire operating area was given as 20 mm$^2$, the turn-off operation up to a current of 150 A could be performed.

Figure 22:
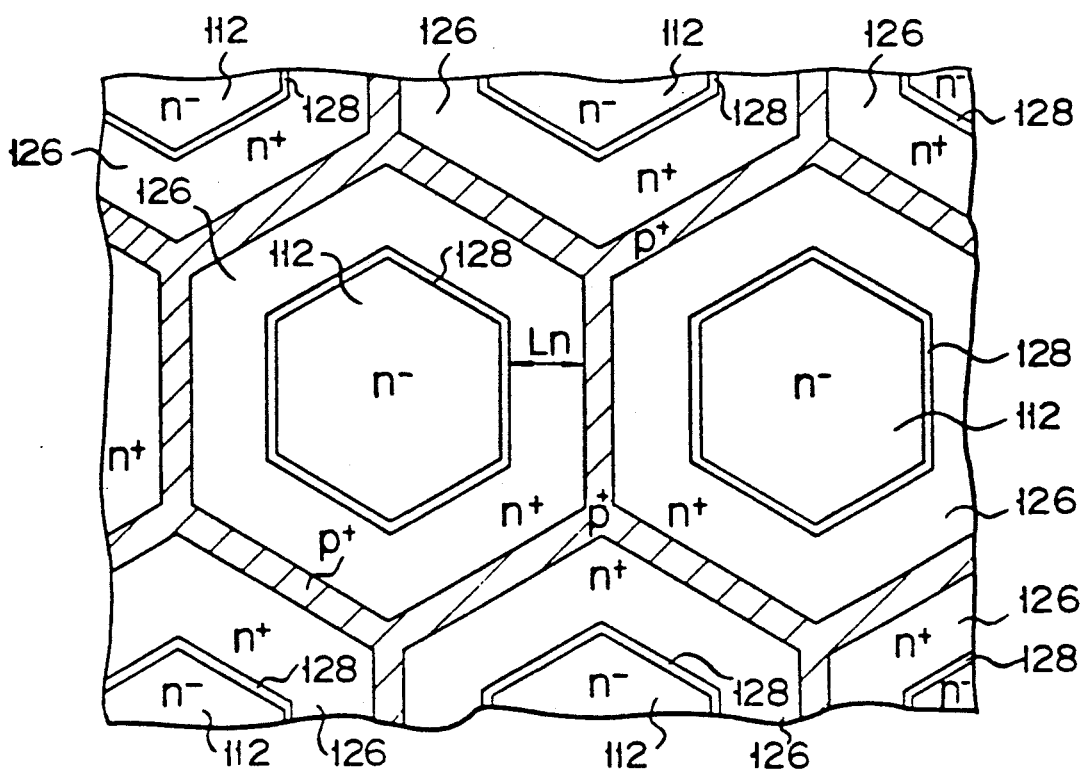
FIG. 22 is a plan view of a conductivity modulated MOSFET according to an eighth embodiment of the present invention.

The present invention is not limited to the particular embodiments described above. For example, the shape of the layer 112 exposed on the surface of the wafer need not be a rectangular shape. As shown in FIG. 22, the layer 112 may have a hexagonal shape. In this embodiment, a channel region 128 is formed to surround a hexagonal high-resistance layer 112. The same reference numerals as in FIG. 22 denote the same parts as in FIG. 17. Assume that a width of a source diffusion layer 126 is given as Ln and that a sum (i.e., perimeter) of the widths of the channel region 128 is given as T (=W). A path of the hole current flowing from the layer 112 to p and p+-type layers 122 and 116 through a portion under the channel region 128 comprises a radial path spreading from the center to the outer direction. The base resistance Rb under the source layer is smaller than that in the case wherein the current path is directed from the outer side of the inner side, if T in the former is equal to that in the latter.

In equation (14), SG is the area of the exposed portion of the layer 112 and T is the perimeter of the exposed portion. A product SG·Rb of MOSFET having the current path directed from the inner to outer sides can be decreased, as compared with the MOSFET having the current path directed from the outer to inner sides if T in the former is equal to that in the latter. Therefore, the latch-up current density JL can be increased.

The island high-resistance layer may resemble a rectangle having at least two parallel side wherein the channel regions are formed along the four sides or two long sides.

Figure 23:
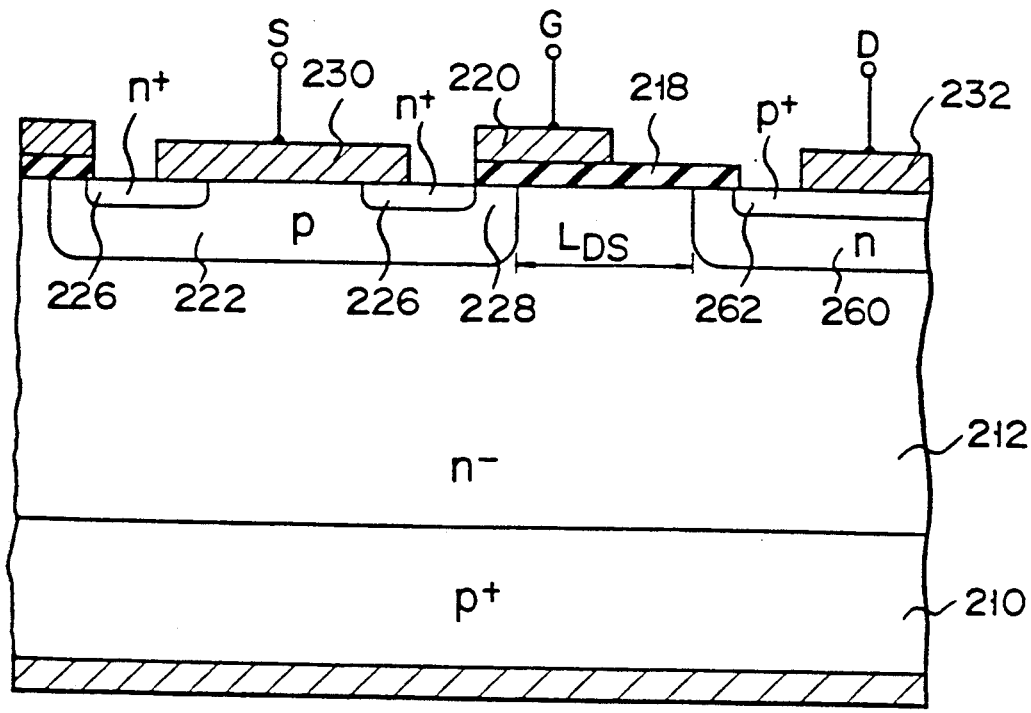
FIGS. 23 and 24 are sectional views of conductivity modulated MOSFETs according to ninth and tenth embodiments of the present invention, respectively.

In the embodiment described above, the drain electrode is formed on a surface opposite to that having the source and gate electrodes. In other words, a vertical MOSFET is exemplified. However, the present invention can also be applied to a lateral MOSFET, as shown in FIG. 23. FIG. 23 is a sectional view showing the main part of a lateral MOSFET. An n⁻-type high-resistance layer 212 is formed on a p⁺-type layer 210. A p-type base diffusion layer 222 and an n⁺-type source diffusion layer 226 are formed in the surface of the layer 212. A gate electrode 220 is formed on a gate insulating film 218 which is formed on a channel region 228 between the layers 226 and 212. A source electrode 230 is formed to contact the layers 226 and 222. The basic structure of this MOSFET is the same as that of each of the above embodiments. In addition, according to this embodiment, an n-type layer 260 is formed in the surface of the n⁻-type layer 212, and a p⁺-type drain layer 262 is formed in the layer 260. A drain electrode 232 is formed on the drain layer 262. The layer 260 prevents extension of a depletion layer produced when the conductivity modulated MOSFET is operated in a forward blocking region, thereby decreasing the width LDs of the window of the layer 212. The p-type base diffusion layer 222 may completely surround the window of the layer 212 to obtain the same effect as in the previous embodiments. The entire remaining embodiments according to this invention may be applied to the above lateral element.

Figure 24:
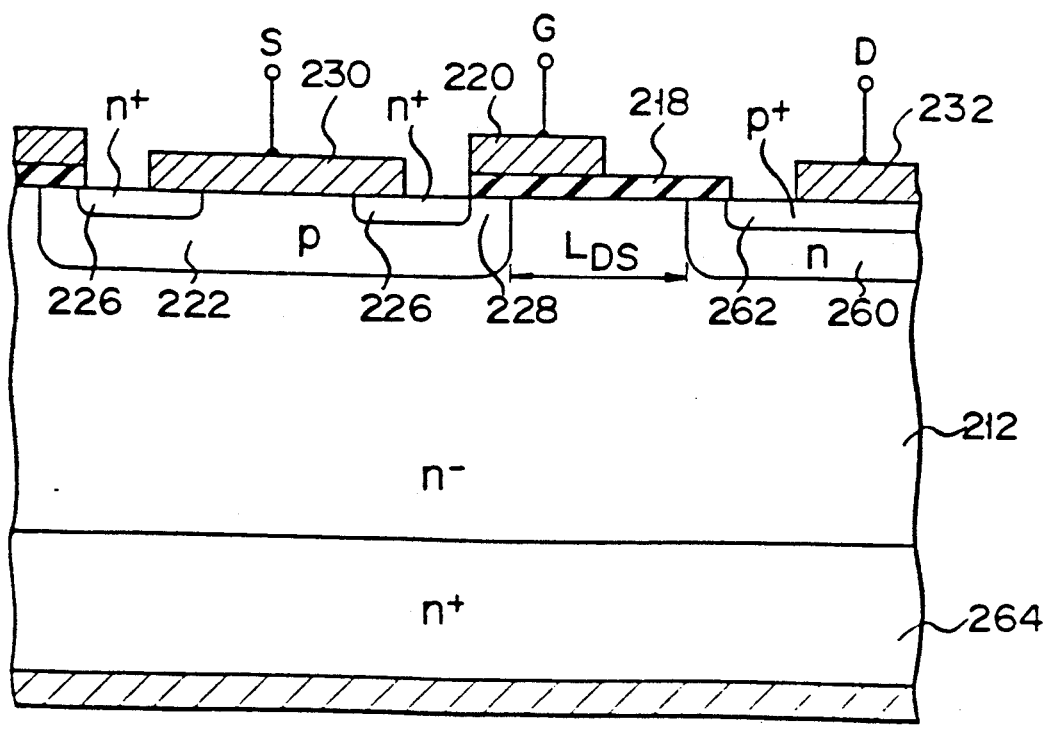

As shown in FIG. 24, the p⁺-type layer 210 of FIG. 23 may be replaced with a n⁺-type layer 264.

In the embodiments after following the seventh embodiment, if conductivity modulated MOSFETs are prepared to satisfy equations (9) or (10), the latch-up phenomenon can be further prevented.

In the entire embodiments, the n⁻-type high-resistance layer may be used as a starting substrate to form the other semiconductor layers.

What is claimed is:

1. A conductivity modulated metal oxide semiconductor field effect transistor, comprising:
    a first conductivity type region having a first surface;
    a high resistance semiconductor region of a second conductivity type having a second surface;
    a second conductivity type region provided between said first conductivity type region and said high resistance semiconductor region and having an impurity concentration higher than that of said high resistance semiconductor region;
    a base region of the first conductivity type which is formed in the second surface of said high resistance semiconductor region;
    a source region of the second conductivity type which is formed in said base region;
    a gate electrode formed at least on a gate insulating film which is formed on a channel region formed in said base region between said high resistance semiconductor region and said source region;
    a source electrode ohmic-contacting said source and base regions; and
    a drain electrode formed on said first surface of the first conductivity type region,
    wherein said source region comprises a plurality of separated sections in a contact area between said source electrode and said base and source regions to set a specific drain current of said transistor at a value lower than a latch-up current of the transistor, the specific drain current being defined as a drain current when $10^2 \cdot d(V)$ is applied to said gate electrode and 100 V is applied to said drain electrode, wherein when a 100-V constant voltage source is directly connected between said source and drain electrodes of said conductivity modulated metal oxide semiconductor field effect transistor, a gate voltage is increased from 0 V to $10^2 \cdot d(V)$ within 200 nsec to make said conductivity modulated metal oxide semiconductor field effect transistor turned on, said transistor is turned on for 10 μsec, and thereafter the gate voltage is decreased from $10^2 \cdot d(V)$ to 0 (V) within 200 nsec, said conductivity modulated metal oxide semiconductor field effect transistor is not latched up but turned off at a temperature at 25° C., wherein d is the thickness (μm) of the gate insulating film.

2. The transistor according to claim 1, wherein portions of said high resistance semiconductor region are surrounded by said base region to constitute island regions.

3. The transistor according to claim 2, wherein peripheries of said portions have rectangular shapes.

4. The transistor according to claim 1, wherein said gate electrode comprises a polycrystalline silicon film and a metal film formed on a portion of said polycrystalline silicon film, said base region of the first conductivity being formed under said metal film.

5. The transistor according to claim 1, wherein portions of said high resistance semiconductor region are surrounded by said base region to constitute island regions.

6. The transistor according to claim 5, wherein peripheries of said portions have rectangular shapes.

7. The transistor according to claim 1, wherein said gate electrode comprises a polycrystalline silicon film and a metal film formed on a portion of said polycrystalline silicon film, said base region of the first conductivity being formed under said metal film.

8. A conductivity modulated metal oxide semiconductor field effect transistor, comprising:
    a first conductivity type region having a first surface;
    a high resistance semiconductor region of a second conductivity type having a second surface;
    a second conductivity type region provided between said first conductivity type region and said high resistance semiconductor region and having an impurity concentration higher than that of said high resistance semiconductor region;
    a base region of the first conductivity type which is formed in the second surface of said high resistance semiconductor region;
    a source region of the second conductivity type which is formed in said base region,
    a gate electrode formed at least on a gate insulating film which is formed on a channel region formed in said base region between said high resistance semiconductor region and said source region;
    a source electrode ohmic-contacting said source and base regions; and a drain electrode formed on said first surface of the first conductivity type region;

wherein W/T is set at a value less than 1 to set a specific drain current of said transistor at a value lower than a latch-up current of the transistor, the specific drain current being defined as a drain current when $10^2 \cdot d(V)$ is applied to said gate electrode and 100 V is applied to said drain electrode, wherein when a 100-V constant voltage source is directly connected between said source and drain electrodes of said conductivity modulated metal oxide semiconductor field effect transistor, a gate voltage is increased from 0 V to $10^2 \cdot d(V)$ within 200 nsec to make said conductivity modulated metal oxide semiconductor field effect transistor turned on, said transistor is turned on for 10 μsec, and thereafter the gate voltage is decreased from $10^2 \cdot d(V)$ to 0 (V) within 200 nsec, said conductivity modulated metal oxide semiconductor field effect transistor is not latched up but turned off at a temperature at 25° C., wherein d is the thickness (μm) of the gate insulating film, W is the channel width (μm) within 1 cm² of an active region and T is a perimeter (μm) of said base region which contacts said high resistance semiconductor region within 1 cm² of the active region.

9. The transistor according to claim 8, wherein portions of said high resistance semiconductor region are surrounded by said base region to constitute island regions.

10. The transistor according to claim 9, wherein peripheries of said portions have rectangular shapes.

11. The transistor according to claim 8, wherein said gate electrode comprises a polycrystalline silicon film and a metal film formed on a portion of said polycrystalline silicon film, said base region of the first conductivity being formed under said metal film.

* * * * *